United States Patent
Gill et al.

(10) Patent No.: US 7,565,733 B2
(45) Date of Patent: Jul. 28, 2009

(54) PROCESS FOR THE FABRICATION OF MULTILAYER THIN FILM MAGNETORESISTIVE SENSORS

(75) Inventors: Hardayal Singh Gill, Palo Alto, CA (US); Wipul Pemsiri Jayasekara, Los Gatos, CA (US); Huey-Ming Tzeng, San Jose, CA (US); Xiao Z. Wu, San Jose, CA (US)

(73) Assignee: Hitachi Global Storage Technologies Netherlands B.V., Amsterdam (NL)

(*) Notice: Subject to any disclaimer, the term of this patent is extended or adjusted under 35 U.S.C. 154(b) by 433 days.

(21) Appl. No.: 11/436,966

(22) Filed: May 16, 2006

(65) Prior Publication Data

US 2007/0266549 A1 Nov. 22, 2007

(51) Int. Cl.
*G11B 5/127* (2006.01)
*H04R 31/00* (2006.01)

(52) U.S. Cl. ............. 29/603.16; 29/603.11; 29/603.13; 29/603.15; 204/192.34; 216/62; 216/65; 216/66; 360/324.11

(58) Field of Classification Search . 29/603.11–603.16, 29/603.18; 204/192.34; 216/62, 65, 66; 428/692, 694; 360/324.11
See application file for complete search history.

(56) References Cited

U.S. PATENT DOCUMENTS

| 5,301,079 | A  | * | 4/1994  | Cain et al. ............... 440/88 M |
| 6,696,226 | B1 |   | 2/2004  | Dinan et al. |
| 6,859,998 | B2 |   | 3/2005  | Kruger et al. |
| 2003/0168627 | A1 |   | 9/2003  | Singh et al. |
| 2003/0179497 | A1 |   | 9/2003  | Harris, III et al. |
| 2004/0262258 | A1 |   | 12/2004 | Hoehn et al. |
| 2006/0132983 | A1 | * | 6/2006  | Osugi et al. ................. 360/313 |

* cited by examiner

*Primary Examiner*—Paul D Kim
(74) *Attorney, Agent, or Firm*—D'Arcy H. Lorimer; Lorimer Labs

(57) ABSTRACT

An improved method for the manufacture of magnetoresistive multilayer sensors is disclosed. The method is particularly advantageous for the production of magnetic tunnel junction (MTJ) sensors, which can be damaged at the air bearing surface by conventional lapping and ion milling. The disclosed process protects the ABS of the magnetoresistive sensor by depositing a diamond like carbon layer which remains in place through ion milling. The DLC layer is removed by oxidation subsequent to the formation of the ABS.

22 Claims, 13 Drawing Sheets

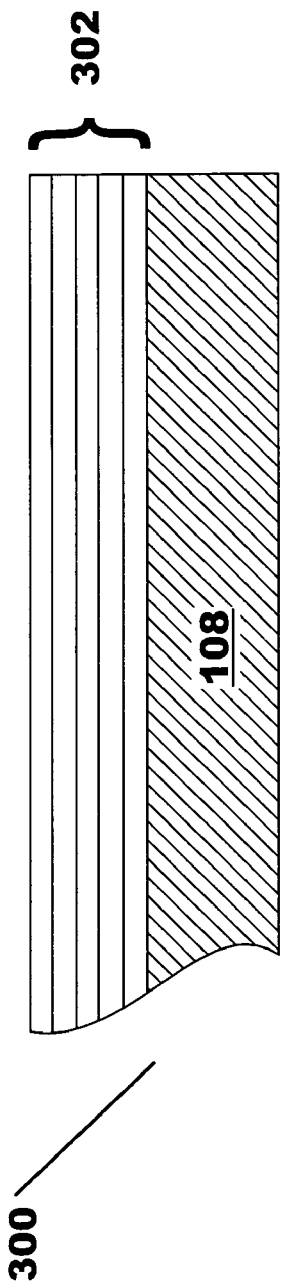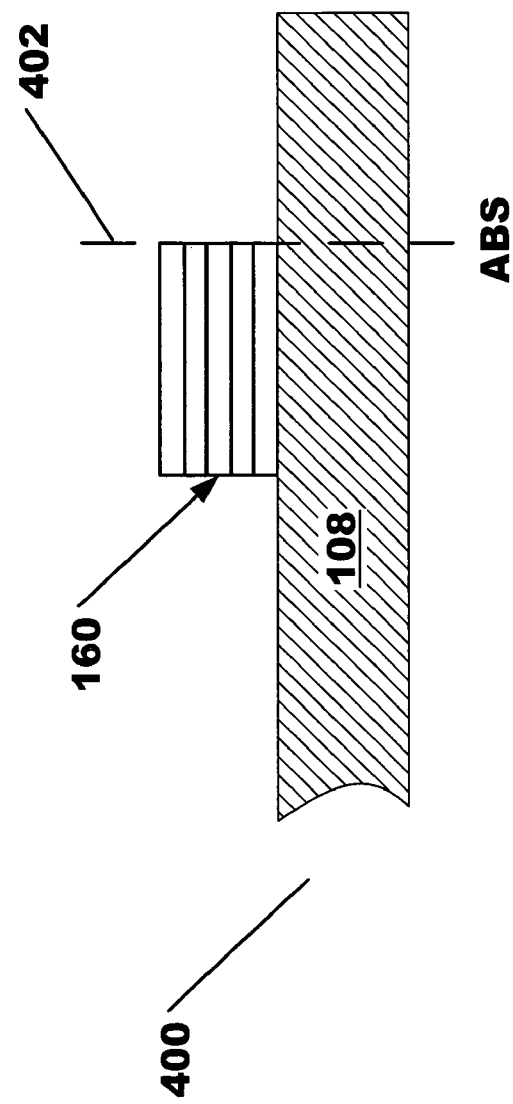

PROCESS FOR THE FABRICATION OF MULTILAYER THIN FILM MAGNETORESISTIVE SENSORS

BACKGROUND OF THE INVENTION

1. Field of the Invention

This invention relates to the process of fabricating thin film multi-layer magnetoresistive sensors. More specifically, the invention relates to a process for reducing damage to magnetic tunnel junction (MJT) sensors during the formation of the air bearing surface.

2. Description of the Related Art

FIG. 1 (Prior Art) is a partial cross sectional view of a thin film read/write head combination. A read head 104 employing multiplayer thin film magnetoresistive (MR) sensor 106 is combined with an inductive write head 102 to form a combined magnetic head 100. In a magnetic disk or tape drive an air bearing surface (ABS) of the combined magnetic head is supported adjacent to the moving magnetic media to write information on or read information from a surface of the media. In a write mode, information is written to the surface by magnetic fields that fringe across gap 114 between upper pole piece 112 and lower pole 116 piece of the write head 102. Write head 102 also comprises yoke 120, coil 118, backgap 122, insulation layers 124, lower pole layer 126, and insulation layer 128. MR sensor 106 is situated between two shield layers 108 and 110 and an oxide layer 109. In a read mode, the resistance of MR sensor 106 changes proportionally to the magnitudes of the magnetic fields from the moving magnetic media. When a sense current is conducted through MR sensor 106, resistance changes cause potential changes that are detected and processed as playback signals.

The MR sensor may be any one of a plurality of MR-type sensors, including anisotropic magnetoresistive (AMR), giant magnetoresistive (GMR), magnetic tunnel junction (MTJ) or tunneling giant magnetoresistive (TMR), spin valve, spin tunneling, and current perpendicular to plane (CPP) sensors. MTJ sensors typically employ a multi-layered structure which includes a tunnel barrier layer positioned between two groups of ferromagnetic layers. The entire multi-layer structure is often referred to as a "stack". The tunnel barrier is a very thin dielectric layer, composed of a material such as aluminum oxide, while the two groups ferromagnetic layers are typically formed of a plurality of electrically conductive ferromagnetic materials and layers. On one side of the tunnel barrier, the magnetization direction of the ferromagnetic layers is "pinned" and provides a reference direction for the MTJ head. However, the magnetization direction of the ferromagnetic layers formed on the other side of the tunnel barrier rotates freely in response to an external magnetic field from the magnetic medium proximate to the ABS. As the magnetization of the freely rotating ferromagnetic layer rotates in response to the external magnetic field from the magnetic medium, the resistance of the tunnel barrier changes, which can be measured as a change in resistance of the MTJ sensor.

FIG. 2 (Prior Art) is a schematic block diagram 200 of a simplified process for making a MTJ sensor. This process is not limited to the MTJ sensors, but applies to other types of multi-layer MR sensors as well. In step 202, the multi-layer stack 106 is formed on shield layer 108. This is followed by deposition of oxide layer 109 and shield layer 110, and the remaining write head structure above shield 110. In step 204, the structure is mechanically lapped perpendicular to layers 108-110 (and the layers in the MJT sensor) to initiate formation of the ABS. The term initiate is used to denote that the actual ABS is formed in a subsequent ion milling step 206, which removes typically 5 to 10 nm of mechanical damage (smearing and debris) at the lapping surface. The layer of smearing and debris is detrimental to the sensitivity of the MJT sensor because the layer forms a low resistance path across the insulating tunnel barrier. However, the ion milling process can also introduce damage into the structure of the MJT sensor.

What is needed is a process for forming the ABS of a multi-layer MR sensor that avoids the damage produced by mechanical lapping and the subsequent ion milling of the prior art.

United States Patent Application Publication 2004/0262258 discloses a method of forming a tunneling magnetoresistive head which begins by forming a tunneling magnetoresistive stack having a tunnel barrier. An air bearing surface is formed of the tunneling magnetoresistive stack. The air bearing surface is ion etched causing a deficiency of a constituent in a portion of the tunnel barrier adjacent the air bearing surface. The deficiency of the constituent is replenished in the portion of the tunnel barrier adjacent the air bearing surface to restore the electrical properties of the tunnel barrier.

United States Patent Application Publication 2003/0179497 discloses a magnetic head having improved overwrite capabilities and reduced fringing fields along with methods of making the same. The magnetic head has a first pole piece and a second pole piece. The first pole piece includes a first bottom pole piece layer, a pedestal portion formed over the first bottom pole piece layer, and a notched top pole portion formed over the pedestal portion. A gap layer separates the second pole piece from the notched top pole portion. The pedestal portion has a first saturation magnetization $M._{S1}$ and the top pole portion has a second saturation magnetization $M._{S2}$ that is greater than the first saturation magnetization $M._{S1}$. The top pole portion has a substantially planar top surface over which a portion of the gap layer and the second pole piece are formed.

United States Patent Application Publication 2003/0168627 discloses a slurry for chemical mechanical polishing (CMP) of a refractory metal based barrier film which includes a plurality of composite particles and at least one selective adsorption additive, such as a surfactant or a polymer. The composite particles have an inorganic core surrounded by the selective adsorption additive. The refractory metal based barrier film does not substantially adsorb the selective adsorption additive surfactant, while other exposed films substantially adsorb the surfactant. A method for chemical mechanical polishing (CMP) a refractory metal based barrier film includes the steps of providing a slurry including a plurality of composite particles and at least one selective adsorption additive. The invention can be used for a single step CMP process for polishing a structure including a gate or interconnect metal layer, a refractory metal based barrier film and a dielectric film, first removing gate or interconnect overburden metal and then removing the overburden regions of the refractory metal based barrier film in a single polishing step.

U.S. Pat. No. 6,696,226 discloses a method of making a magnetic read/write head using a single lithographic step to define both a write coil and a pole tip structure. The use of a thin image resist layer over a hard reactive-ion etch mask and image transfer techniques allows very high resolution optical lithography which can accommodate formation of a very compact coil and pole structure. The use of a single high resolution lithography step on a planarized structure to define both a write pole tip and a write coil coplanar with the write pole tip avoids the problems of reflective notching associated with lithography to define the pole tip in the vicinity of non-planar features of the coil structure and also eliminates alignment inaccuracies inherent in separate lithography processes for the coil and pole.

U.S. Pat. No. 6,859,998 discloses an article formed as a substrate having a projection extending outwardly therefrom. The article may be a magnetic recording head and the projection a write pole. The projection has a width in a thinnest dimension measured parallel to a substrate surface of no more than about 0.3 micrometers and a height measured perpendicular to the substrate of not less than about 5 times the width. The article is fabricated by forming an overlying structure on the substrate with an edge thereon, depositing a replication layer lying on the edge, depositing a filler onto the edge and the substrate, so that the filler, the replication layer, and the overlying structure in combination comprise a continuous layer on the substrate, selectively removing at least a portion of the replication layer from a free surface of the continuous layer inwardly toward the substrate, to form a defined cavity, and depositing a projection material into the defined cavity to form the projection.

SUMMARY OF THE INVENTION

It is an object of the present invention to provide a method for forming a magnetoresistive sensor including forming a magnetoresistive sensor stack, comprising a plurality of sequentially deposited, parallel layers; forming a surface on the magnetoresistive sensor stack, the surface oriented approximately perpendicular to the plurality of sequentially deposited parallel layers; depositing a diamond like carbon layer on the surface of the magnetoresistive sensor stack; and, removing the diamond like carbon layer from the surface of said magnetoresistive sensor stack to form an air bearing surface, the air bearing surface being approximately co-planar with the surface of said magnetoresistive sensor stack.

It is another object of the present invention to provide a method for forming a magnetoresistive sensor including forming a magnetoresistive sensor stack, comprising a plurality of sequentially deposited, parallel layers; forming a surface on the magnetoresistive sensor stack, the surface oriented approximately perpendicular to the plurality of sequentially deposited parallel layers; depositing a diamond like carbon layer on the surface of the magnetoresistive sensor stack, the diamond like carbon layer having an exposed surface subsequent to deposition of the diamond like carbon film; depositing an oxide layer on the exposed surface of the diamond like carbon layer; removing a first portion of the oxide layer by mechanical lapping; removing a second portion of the oxide layer by ion milling subsequent to removing the first portion, the second portion of the oxide layer being removed from at least a portion of the exposed surface of the diamond like carbon layer; and, removing the diamond like carbon layer from the surface of the magnetoresistive sensor stack to form an air bearing surface, the air bearing surface being approximately co-planar with the surface of the magnetoresistive sensor stack.

It is yet another object of the present invention to provide a method for forming a magnetoresistive sensor including forming a magnetoresistive sensor stack, comprising a plurality of parallel layers deposited on a first shield layer; forming a surface on the magnetoresistive sensor stack, the surface oriented approximately perpendicular to the plurality of parallel layers; depositing a diamond like carbon layer on the surface of the magnetoresistive sensor stack, the diamond like carbon layer having an exposed surface subsequent to deposition of the diamond like carbon layer; depositing a second shield layer subsequent to depositing the diamond like carbon layer, such that the magnetorestrictive sensor stack is disposed between the first and second shield layers; and, removing the diamond like carbon layer from the surface of the magnetoresistive sensor stack to form an air bearing surface, the air bearing surface being approximately co-planar with the surface of the magnetoresistive sensor stack.

BRIEF DESCRIPTION OF THE DRAWINGS

The present invention will be better understood when consideration is given to the following detailed description thereof. Such description makes reference to the annexed drawings, wherein:

FIG. 3 is a partial cross sectional view of a sensor structure subsequent to the blanket deposition of the film stack layers in a magnetoresistive (MR) sensor in accordance with an embodiment of the present invention;

FIG. 4 is a partial cross sectional view of a sensor structure subsequent to the defining of the magnetoresistive (MR) sensor in accordance with an embodiment of the present invention;

DETAILED DESCRIPTION OF THE PREFERRED EMBODIMENTS

The present invention discloses an improved method for making multilayer magnetoresistive (MR) sensors. The method eliminates damage caused during the formation of the air bearing surface by mechanical lapping and/or ion milling. The method is particularly suited for the production of magnetic tunnel junction (MTJ) sensors or tunneling magnetoresistive (TMR) sensors, since damage to the barrier oxide layer is to be avoided in these sensors. However, the methods of the present invention are suitable for the production of other types of MR sensors as well.

Figure 1:
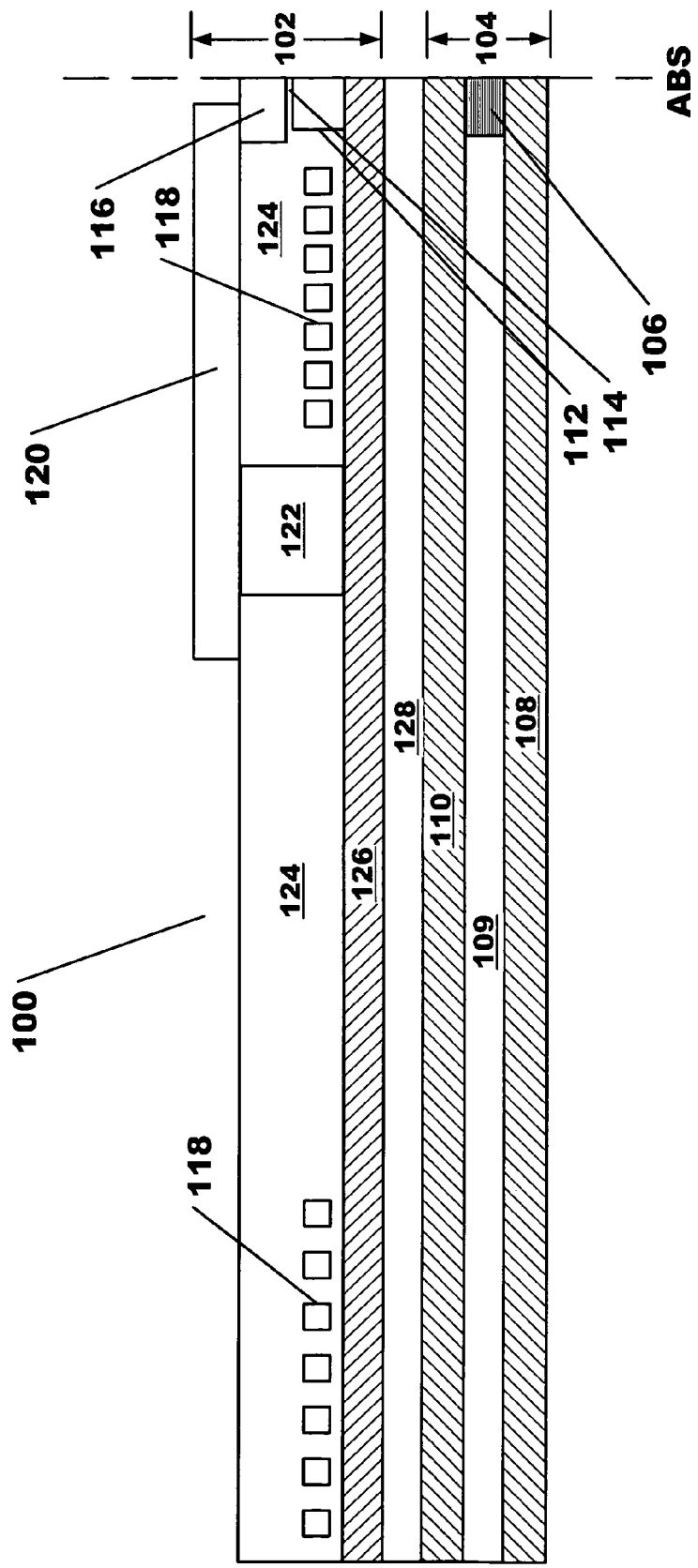
FIG. 1 (Prior Art) is a partial cross sectional view of a thin film read/write head combination.
Figure 2:
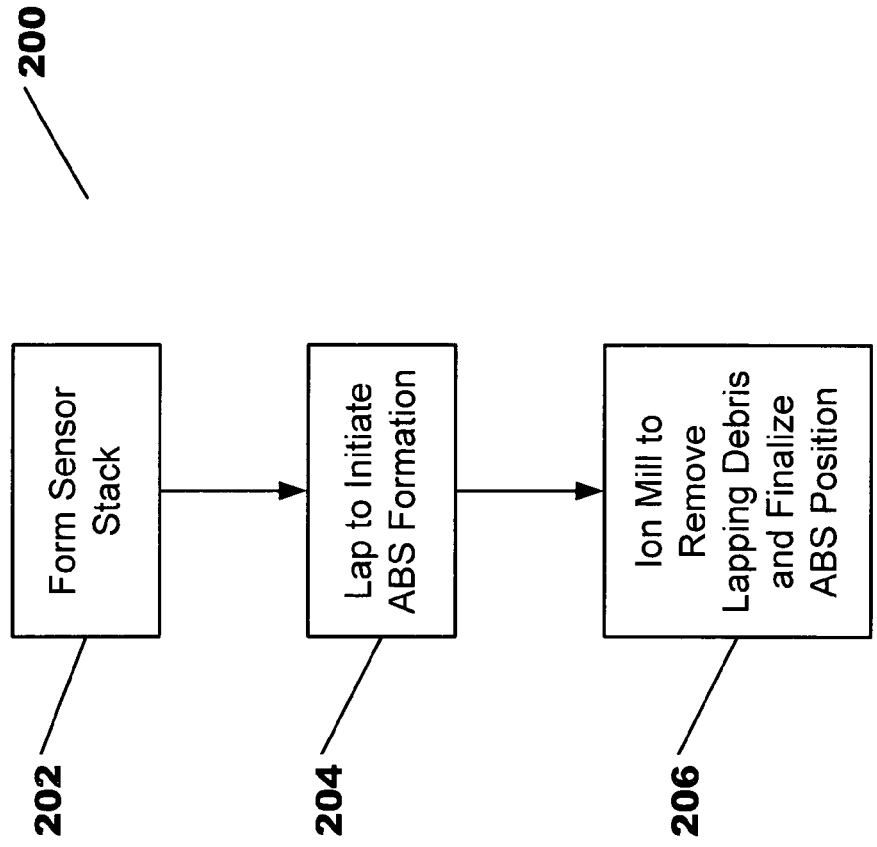
FIG. 2 (Prior Art) is a schematic block diagram of a simplified process for making a MTJ sensor.

FIGS. 1 and 2 (Prior Art) have been discussed above in the Background section.

FIGS. 3-10 illustrate the embodiments of the present invention as applied to the MR sensor solely. FIGS. 11-14 illustrate the embodiments of the present invention as applied to a combined read/write head structure.

FIG. 3 is a partial cross sectional view of a sensor structure 300 subsequent to the blanket deposition of the film stack layers 302 in a magnetoresistive (MR) sensor in accordance with an embodiment of the present invention. Layers 302 comprise the complete stack of materials in a typical MR sensor, preferably a MTJ or TMR sensor. The composition, thickness, number of layers, etc., are well known to those skilled in the art. The layers 302 are deposited on the first shield layer 108, which may or may not be deposited on another substrate.

FIG. 4 is a partial cross sectional view of a sensor structure 400 subsequent to the defining of the magnetoresistive (MR) sensor stack 160 in accordance with an embodiment of the present invention. The lateral dimensions of sensor 160 is defined by lithographic and etching processes well known in the art, as is the projected position of the air bearing surface (ABS) ref 402.

Figure 5:
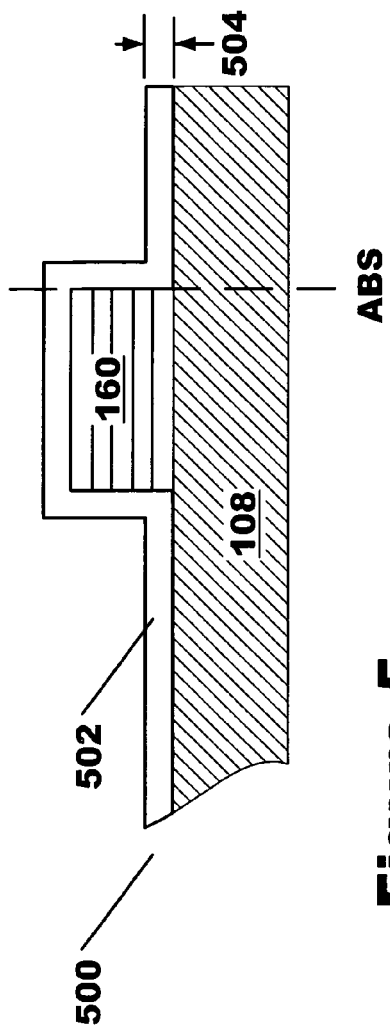
FIG. 5 is a partial cross sectional view of a sensor structure subsequent to the deposition of the DLC layer in accordance with an embodiment of the present invention.

FIG. 5 is a partial cross sectional view of a sensor structure 500 subsequent to the deposition of the DLC layer 502 in accordance with an embodiment of the present invention. Following the defining of MR sensor stack 160 as shown in FIG. 4, a diamond like carbon layer (DLC) is deposited conformally over all exposed surfaces, particularly the vertical surfaces of sensor 160 that define the ABS. The DLC film is deposited to a thickness between 2 and 10 nm.

Figure 6:
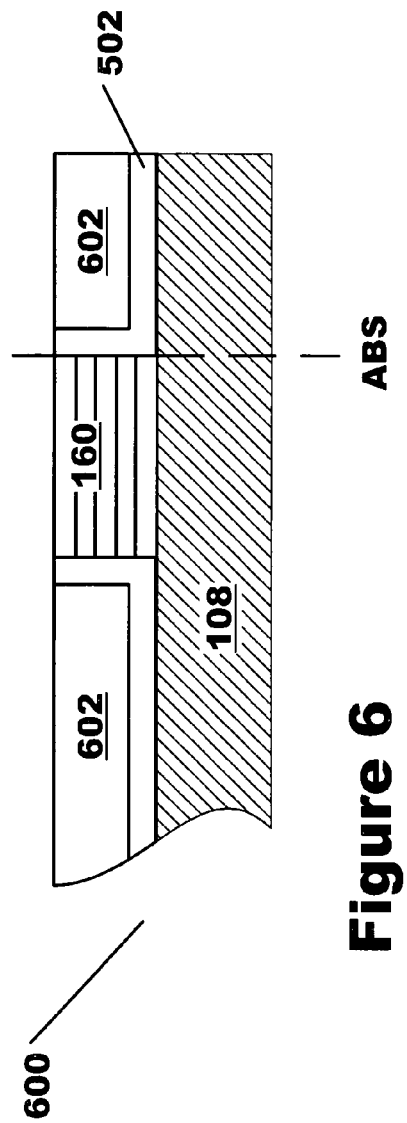
FIG. 6 is a partial cross sectional view of a sensor structure subsequent to the deposition of a filler oxide layer and planarization in accordance with an embodiment of the present invention.

FIG. 6 is a partial cross sectional view of a sensor structure 600 subsequent to the deposition of a filler oxide layer 602 and planarization in accordance with an embodiment of the present invention. Following the deposition of the DLC layer as shown in FIG. 5, an oxide layer 602 is deposited over the DLC layer. Typically, the oxide layer 109 between the first 108 and second 110 shield layers is alumina ($Al_2O_3$). In the present invention, alumina is replaced with oxides of tantalum, preferably $Ta_2O_5$. The purpose is to provide more uniform etching during a subsequent ion milling step and will be discussed in further detail below. Following the oxide deposition, the structure is planarized to expose the top layer of MR sensor 106, by methods well known in the art.

Figure 7:
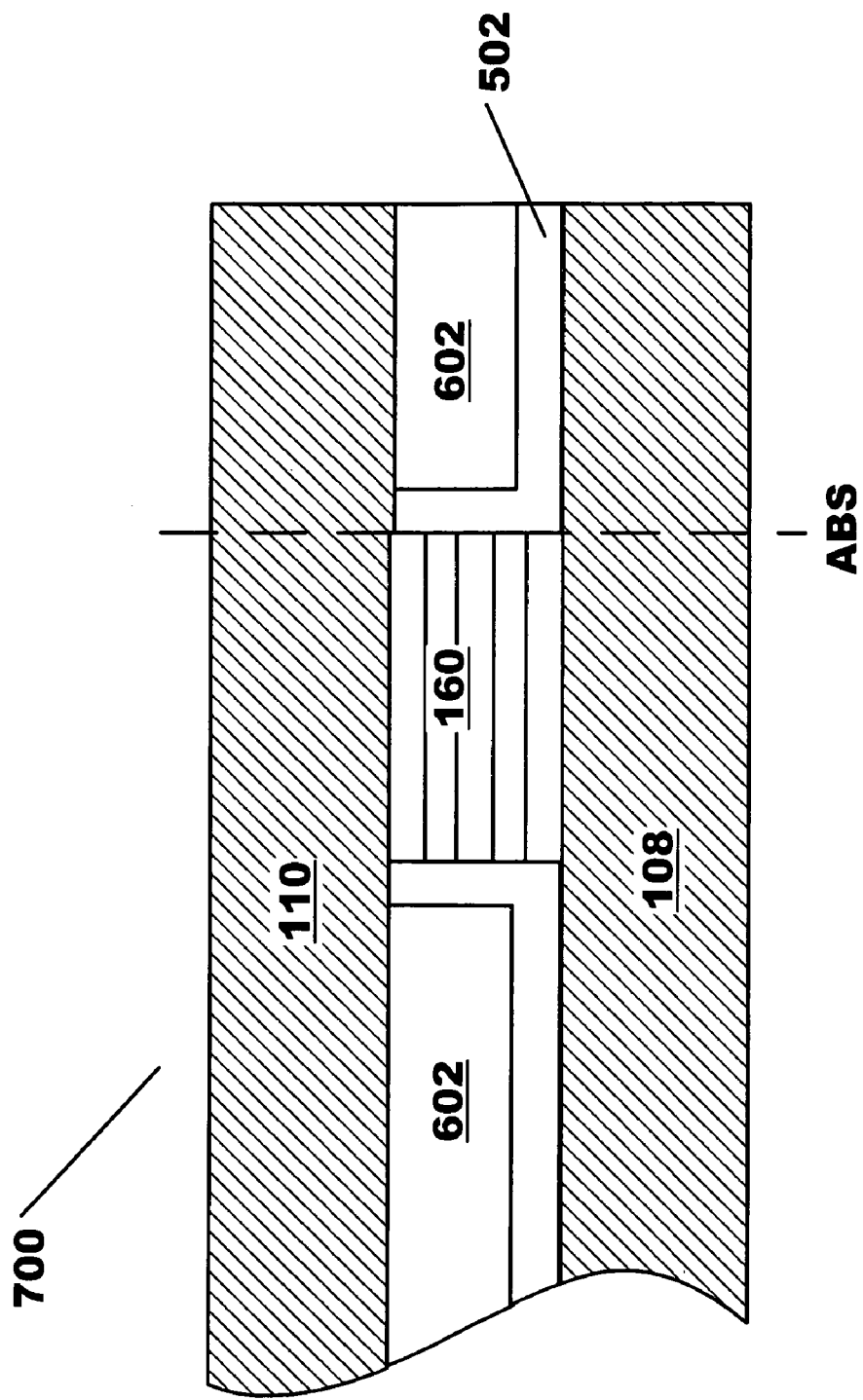
FIG. 7 is a partial cross sectional view of a sensor structure subsequent to the deposition of the second shield layer 110 in accordance with an embodiment of the present invention.

FIG. 7 is a partial cross sectional view of a sensor structure subsequent to the deposition of the second shield layer 110 in accordance with an embodiment of the present invention. At this point, the process for forming the air bearing surface (ABS) will be described. For more detail on forming the ABS in a combined read/write head structure, please see FIGS. 11-14. To form the ABS, all material to the right of the plane indicated by the dashed line in FIG. 7 must be removed. As previously discussed in the Background section, this is typically done in the prior art by mechanical lapping followed by ion milling. The combination of these two processes produces damage to the MR sensor stack 160. In the present invention, DLC layer 502 effectively protects sensor stack 160 and allows formation of the ABS without damage to the sensor layers.

Figure 8:
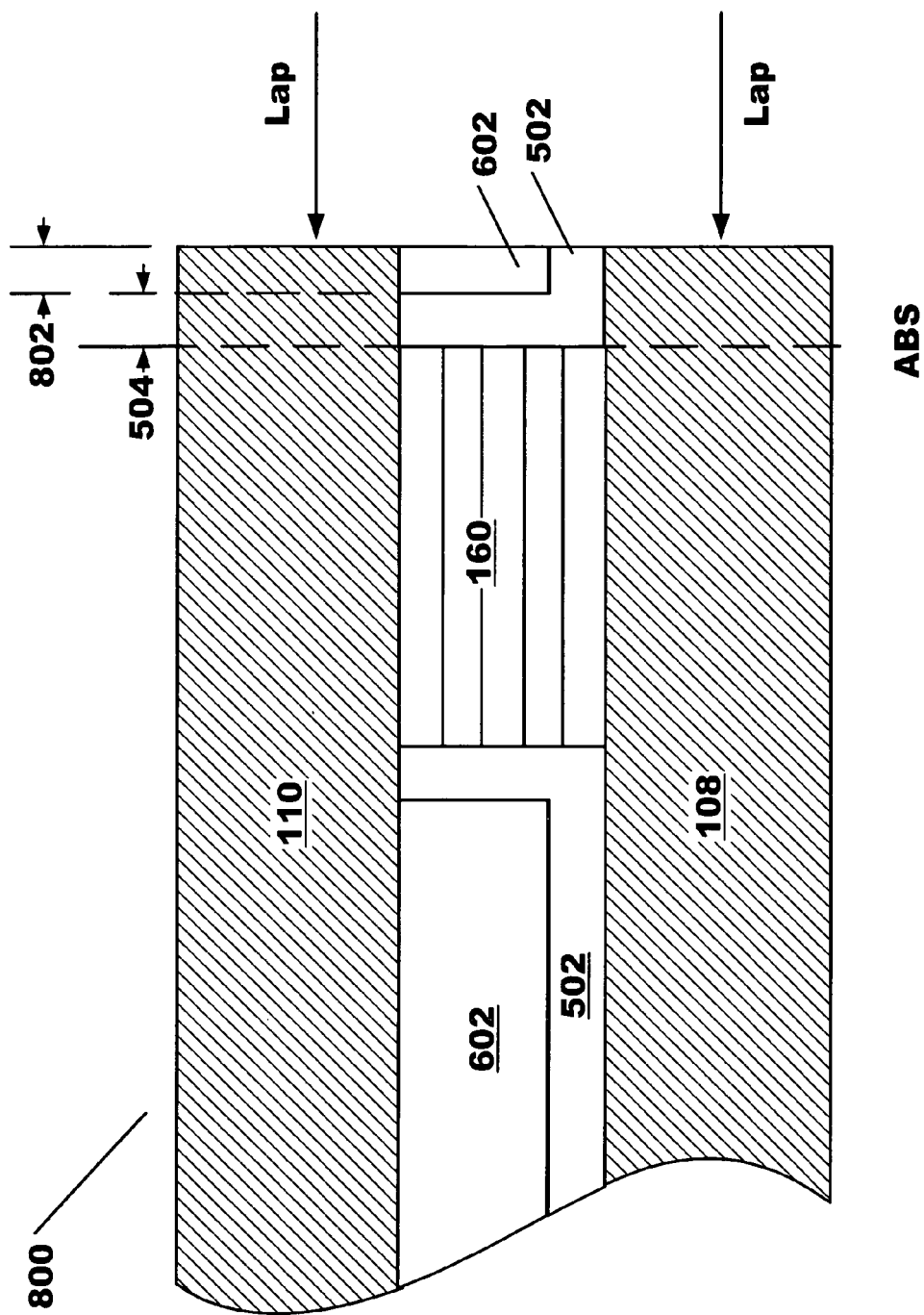
FIG. 8 is a partial cross sectional view of a sensor structure subsequent to the mechanical lapping step in accordance with an embodiment of the present invention.

FIG. 8 is a partial cross sectional view of a sensor structure 800 subsequent to the mechanical lapping step in accordance with an embodiment of the present invention. Mechanical lapping is used to remove the bulk of material to the right of the ABS in FIG. 7, because it is the fastest and most efficient method to remove large amounts of material. The process is stopped short of the anticipated ABS position, by a distance 802, to prevent any smearing or mechanical damage from affecting layers at the ABS. In the present invention, it is also desirable to avoid mechanical lapping of the DLC layer 502 due to the mechanical hardness of this layer. Distance 802 is not critical, and should be between zero and about 10 nm. Subsequent to the mechanical lapping process, ion milling will be carried out to remove additional material. Conditions of the ion milling process are well known to those skilled in the art.

Figure 9:
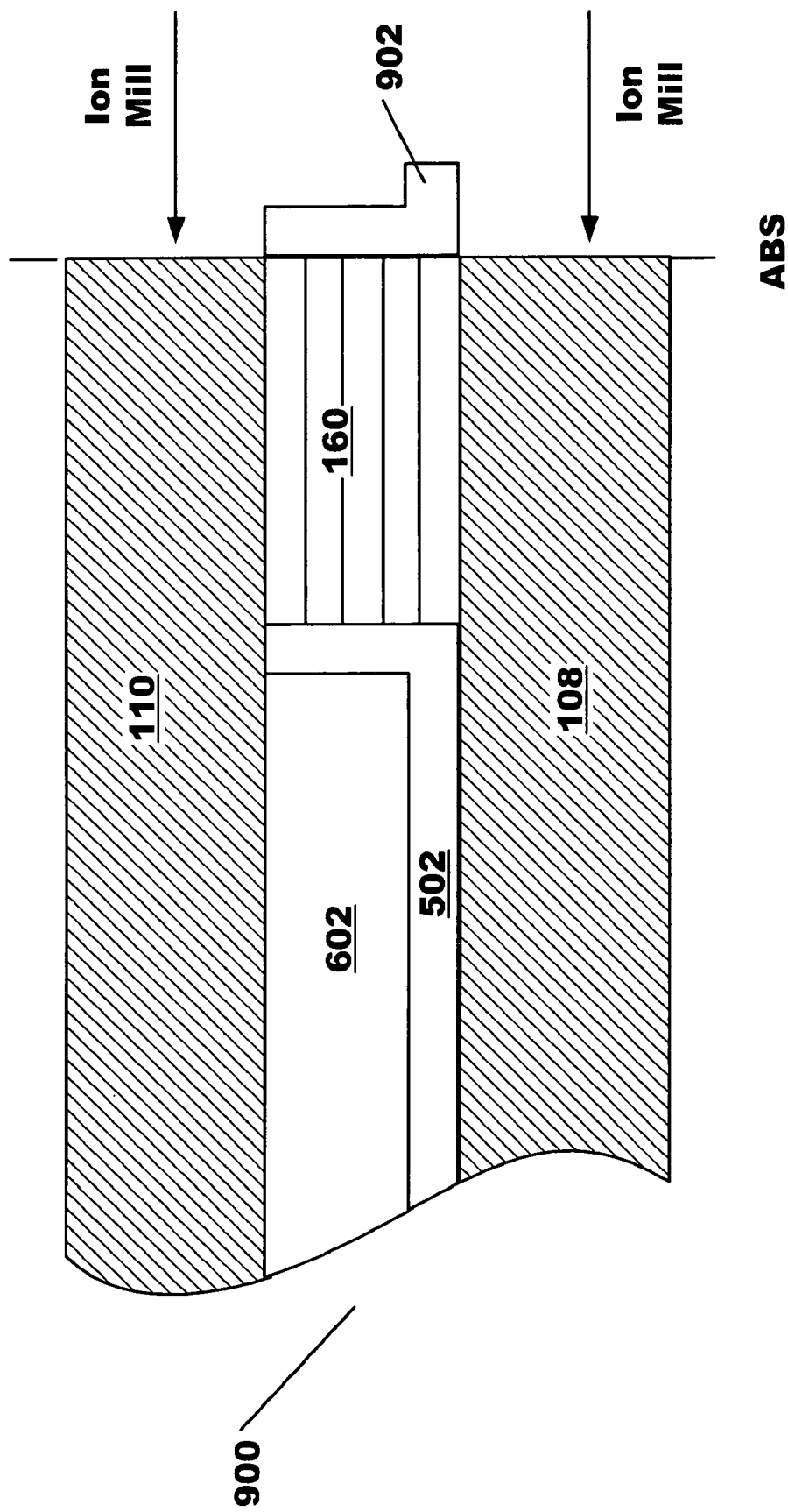
FIG. 9 is a partial cross sectional view of a sensor structure subsequent to the ion milling step in accordance with an embodiment of the present invention.

FIG. 9 is a partial cross sectional view of a sensor structure 900 subsequent to the ion milling step in accordance with an embodiment of the present invention. In accordance with the present invention, tantalum oxide was chosen to provide a faster etch rate than alumina during the ion milling process, to ensure that the outer surfaces of the protective DLC component 902 would be cleared of all oxide material while simultaneously defining the ABS in the layers above and below the MR sensor stack 160. This requires balancing the etch rate of the oxide 602 with that of shield layers 108 and 110. It is imperative that the protective DLC artifact 902 be devoid of oxides covering its surface so that it can easily be removed in a oxidation step. However, once exposed, the surfaces of DLC have a much lower etch rate in the ion milling process, protecting the MR sensor stack 160 from the ion milling damage.

Figure 10:
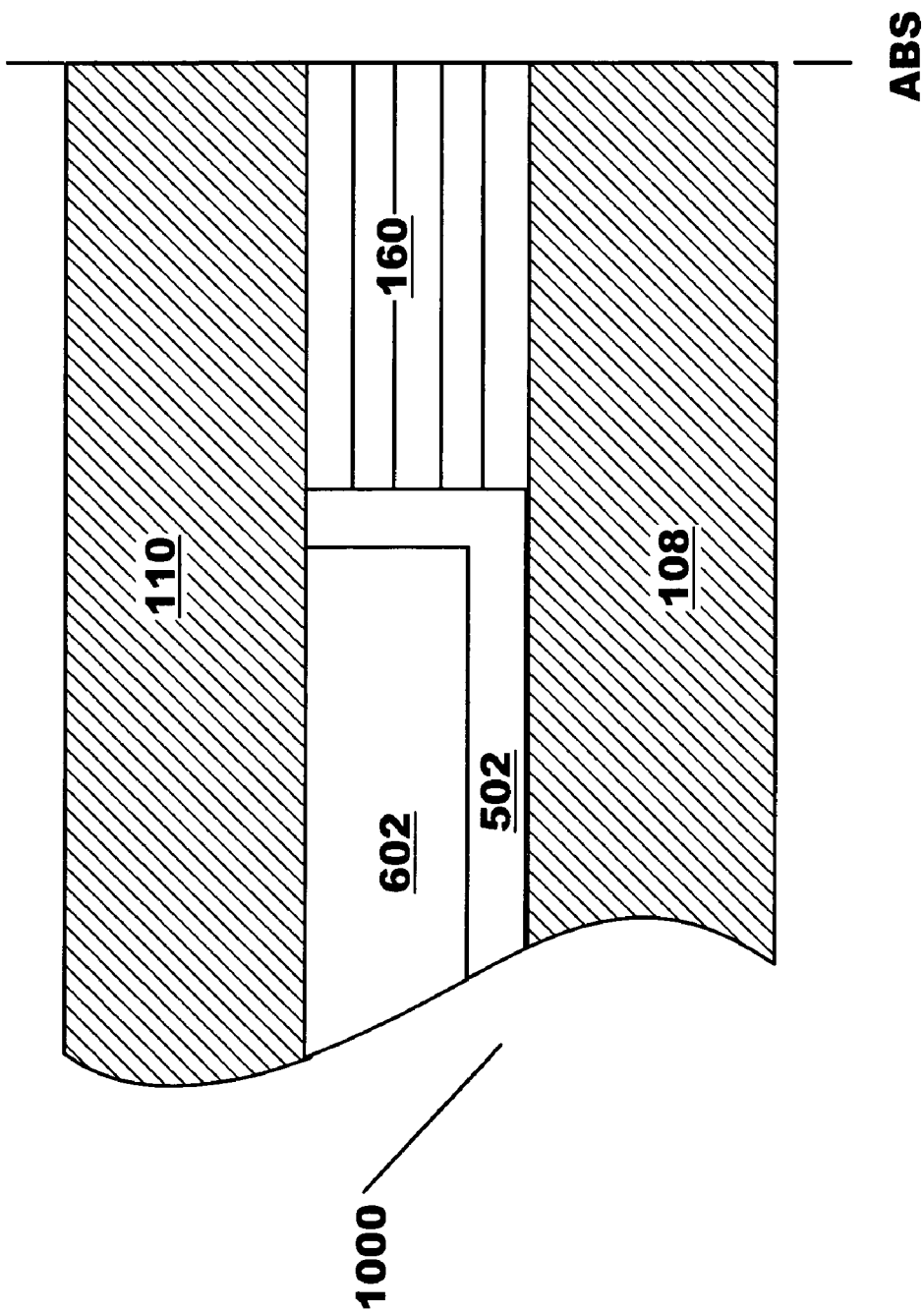
FIG. 10 is a partial cross sectional view of a sensor structure subsequent to the oxidizing etch step in accordance with an embodiment of the present invention.

FIG. 10 is a partial cross sectional view of a sensor structure 1000 subsequent to the oxidizing etch step in accordance with an embodiment of the present invention. The final step in forming the ABS is the removal of the protective DLC artifact 902. This is accomplished in a oxidizing etch step following the ion milling. The oxidation step has little or no impact on the materials comprising the MR sensor stack or the shield layers 108 and 110. DLC layers are easily removed by such an oxidation step due to their carbon content, as is well known to those skilled in the art. In accordance with the present invention, the forgoing processes result in a damage free MR sensor stack at the ABS.

Figure 11:
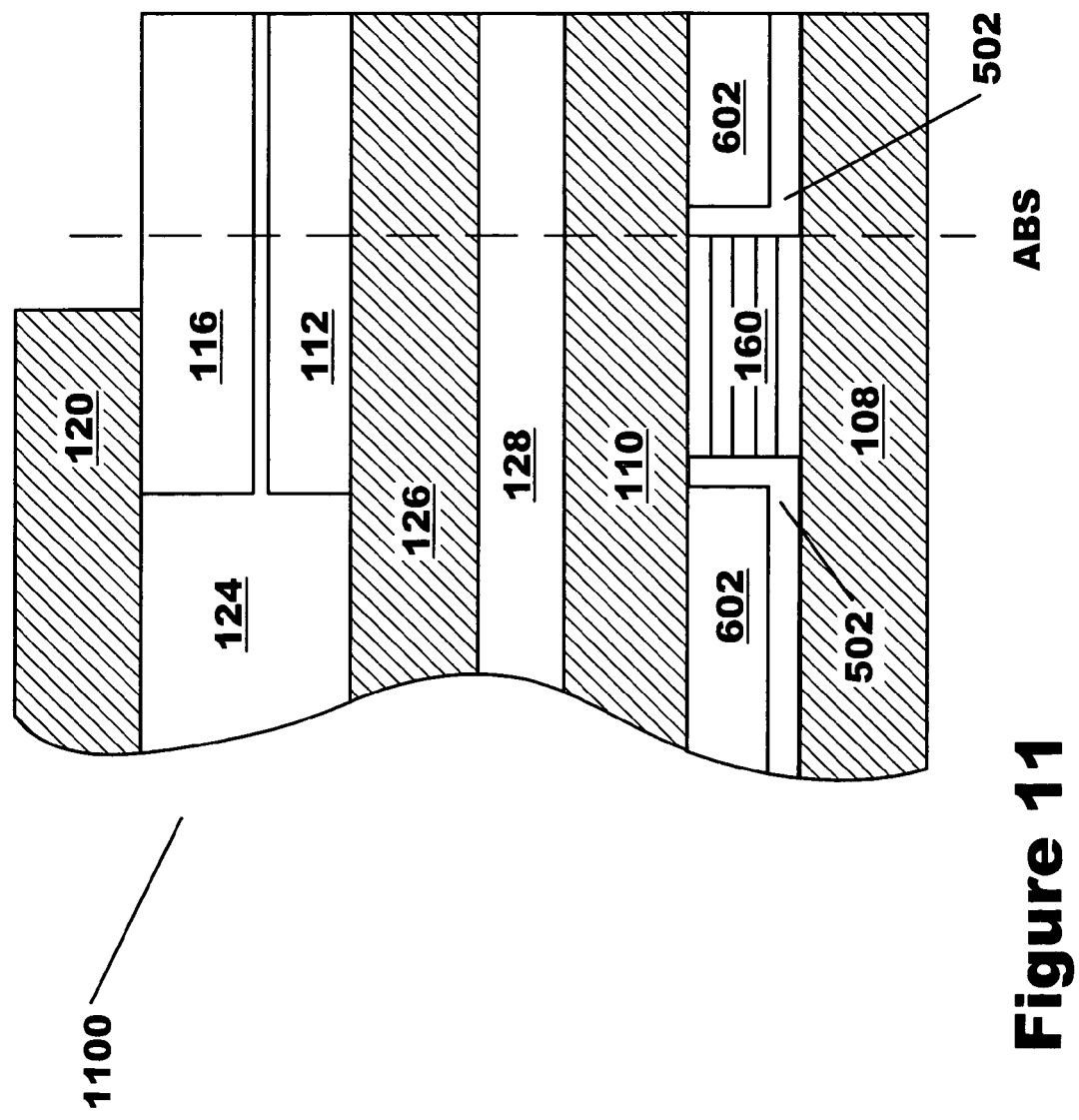
FIG. 11 is a partial cross sectional view of a combined read/write head structure prior to the mechanical lapping step in accordance with an embodiment of the present invention.
Figure 12:
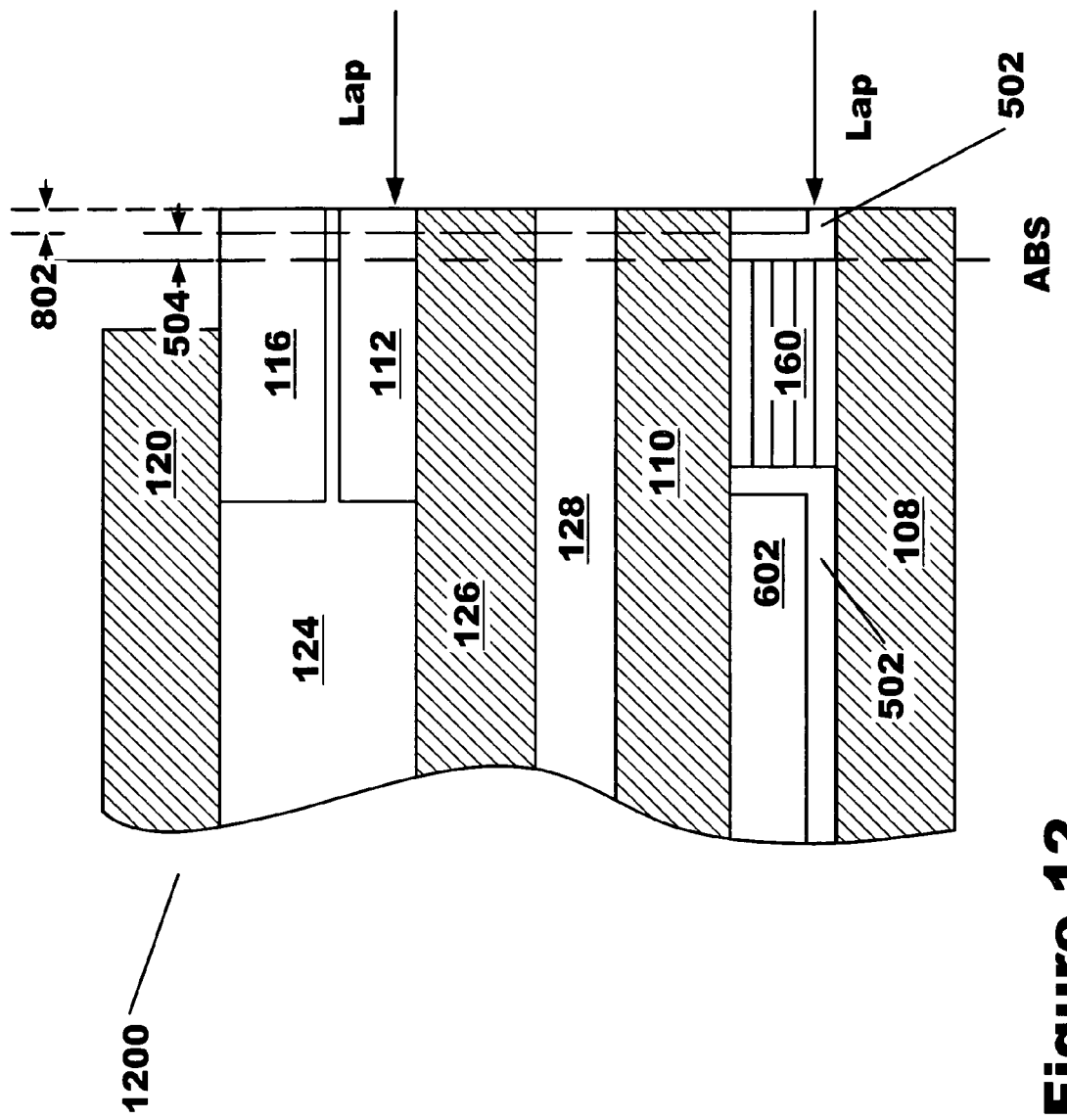
FIG. 12 is a partial cross sectional view of a combined read/write head structure subsequent to the mechanical lapping step in accordance with an embodiment of the present invention.
Figure 13:
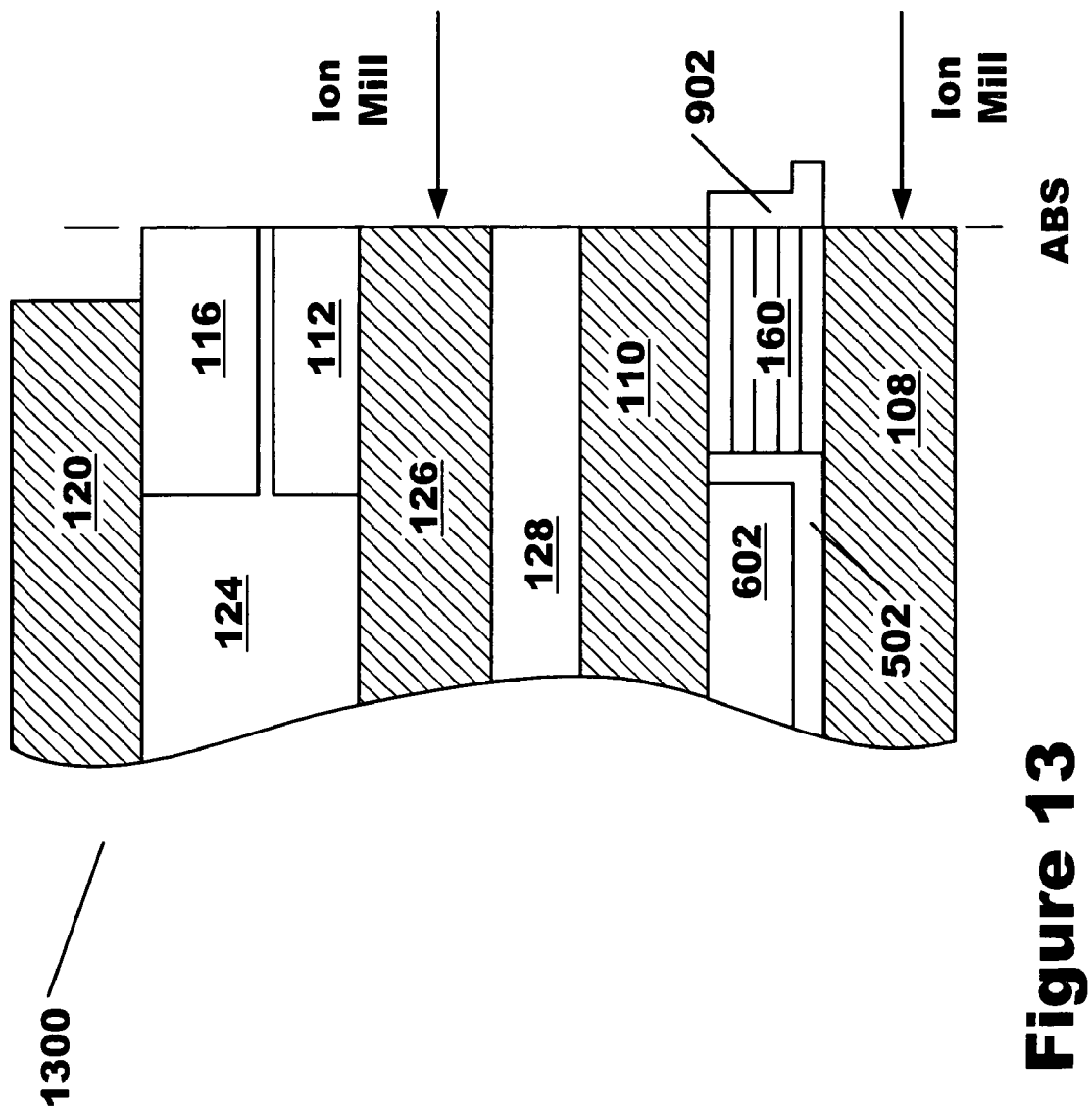
FIG. 13 is a partial cross sectional view of a combined read/write head structure subsequent to the ion milling step in accordance with an embodiment of the present invention.
Figure 14:
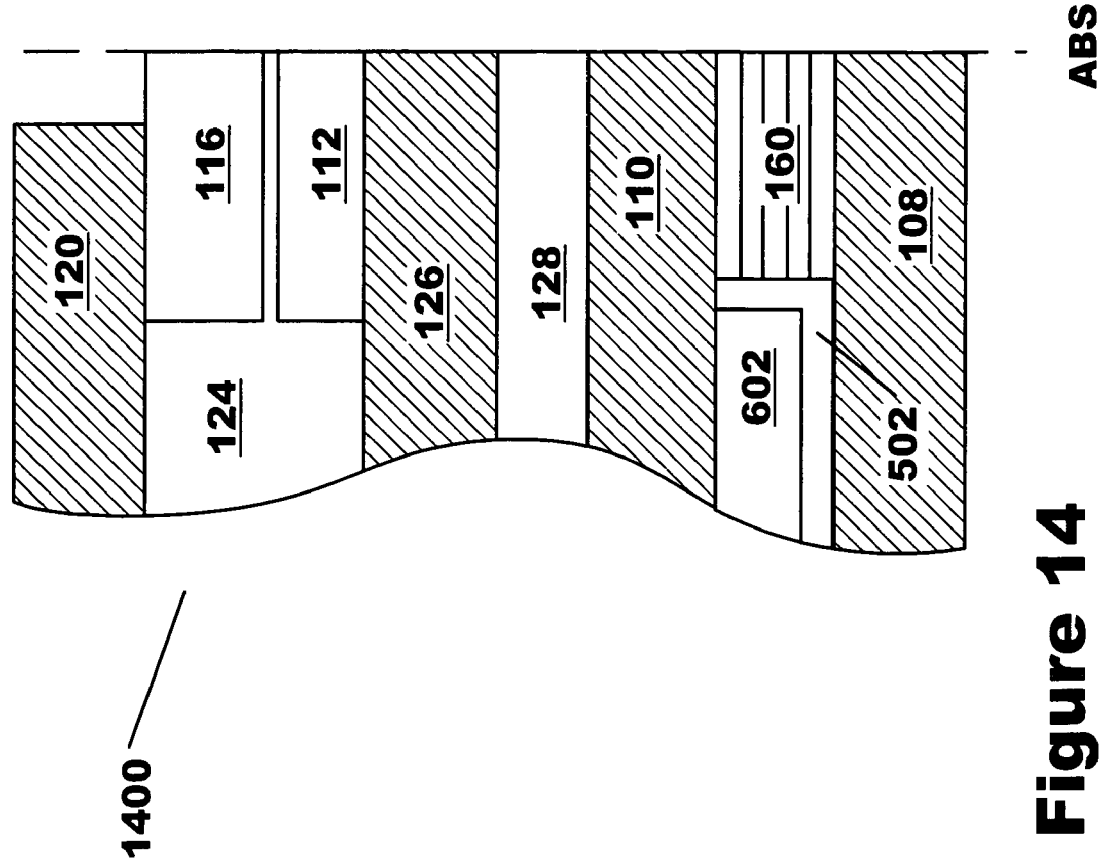
FIG. 14 is a partial cross sectional view of a combined read/write head structure subsequent to the oxidizing etch step in accordance with an embodiment of the present invention; and, FIG. 15 is a schematic block diagram of a simplified process for making a MTJ sensor in accordance with an embodiment of the present invention.

FIGS. 11-14 illustrate the forgoing process steps in the manufacture of a combined read/write head structure. Write coil and backgap details are omitted for clarity. FIG. 11 is a partial cross sectional view of a combined read/write head structure 1100 prior to the mechanical lapping step in accordance with an embodiment of the present invention. FIG. 12 is a partial cross sectional view of a combined read/write head structure 1200 subsequent to the mechanical lapping step in accordance with an embodiment of the present invention. FIG. 13 is a partial cross sectional view of a combined read/write head structure 1300 subsequent to the ion milling step in accordance with an embodiment of the present invention. FIG. 14 is a partial cross sectional view of a combined read/write head structure 1400 subsequent to the oxidizing etch step in accordance with an embodiment of the present invention.

Figure 15:
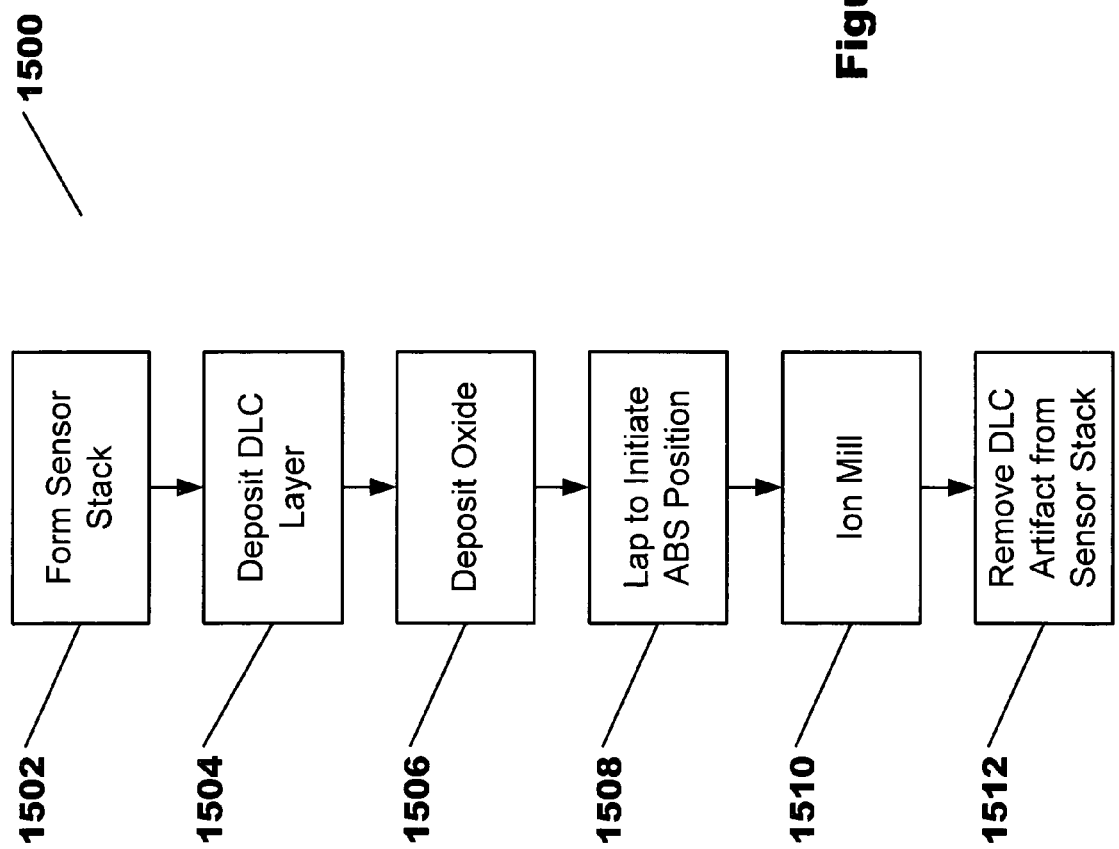

FIG. 15 is a schematic block diagram 1500 of a simplified process for making a MTJ sensor in accordance with an embodiment of the present invention. In step 1502, the MTJ sensor stack is formed. This step includes the deposition of the stack layers and the subsequent defining of the sensor stack, corresponding to the steps illustrated in FIGS. 3 and 4. In step 1504, the DLC layer is deposited on the MTJ sensor stack surfaces, corresponding to FIG. 5 above. In step 1506, the oxide filler layer is deposited, corresponding to FIG. 6. In step 1508, the sensor structure is mechanically lapped, corresponding to FIGS. 8 and 12. In step 1510, the structure is ion milled, corresponding to FIGS. 9 and 13. In step 1512, the DLC protective artifact is removed from the ABS of the MTJ sensor, corresponding to FIGS. 10 and 14.

The present invention is not limited by the previous embodiments heretofore described. Rather, the scope of the present invention is to be defined by these descriptions taken together with the attached claims and their equivalents.

What is claimed is:

1. A method for forming a magnetoresistive sensor comprising:
    forming a magnetoresistive sensor stack, comprising a plurality of sequentially deposited, parallel layers;
    forming a first surface on said magnetoresistive sensor stack, said first surface oriented approximately perpendicular to said plurality of sequentially deposited parallel layers;
    depositing a diamond like carbon layer on said first surface, said diamond like carbon layer having an exposed second surface subsequent to deposition of said diamond like carbon layer;
    depositing an oxide layer on said second surface of said diamond like carbon layer;
    removing a first portion of said oxide layer from at least a portion of said second surface; and
    removing said diamond like carbon layer from said first surface of said magnetoresistive sensor stack to form an air bearing surface, said air bearing surface being approximately co-planar with said first surface of said magnetoresistive sensor stack.

2. The method as recited in claim 1, wherein said oxide layer comprises tantalum oxide.

3. The method as recited in claim 1, further comprising removing a second portion of said oxide layer by mechanical lapping prior to removing said first portion of said oxide layer.

4. The method as recited in claim 1, wherein said first portion of said oxide layer is removed by ion milling.

5. The method as recited in claim 1 wherein said diamond like carbon film is removed by oxidation.

6. The method as recited in claim 1, wherein said magnetoresistive sensor is a magnetic tunnel junction (MTJ) sensor.

7. The method as recited in claim 1, wherein said diamond like carbon layer is greater than or equal to 2 nm thick, and less than or equal to 10 nm thick.

8. A method for forming a magnetoresistive sensor comprising:
    forming a magnetoresistive sensor stack, comprising a plurality of sequentially deposited, parallel layers;
    forming a first surface on said magnetoresistive sensor stack, said first surface oriented approximately perpendicular to said plurality of sequentially deposited parallel layers;
    depositing a diamond like carbon layer on said first surface, said diamond like carbon layer having an exposed second surface subsequent to deposition of said diamond like carbon layer;
    depositing an oxide layer on said second surface of said diamond like carbon layer;
    removing a first portion of said oxide layer by mechanical lapping;
    removing a second portion of said oxide layer by ion milling subsequent to removing said first portion, said second portion of said oxide layer being removed from at least a portion of said second surface of said diamond like carbon layer; and,
    removing said diamond like carbon layer from said first surface of said magnetoresistive sensor stack to form an air bearing surface, said air bearing surface being approximately co-planar with said first surface of said magnetoresistive sensor stack.

9. The method as recited in claim 8, wherein said oxide layer comprises tantalum oxide.

10. The method as recited in claim 8, wherein said magnetoresistive sensor is a magnetic tunnel junction (MTJ) sensor.

11. The method as recited in claim 8 wherein said diamond like carbon film is removed by oxidation.

12. The method as recited in claim 8, wherein said magnetoresistive sensor is a giant magnetoresistive (GMR) sensor.

13. The method as recited in claim 8, wherein said diamond like carbon layer is greater than or equal to 2 nm thick, and less than or equal to 10 nm thick.

14. The method as recited in claim 8, wherein removing said first portion of said oxide layer by mechanical lapping further comprises lapping to within a distance of said first surface of said magnetoresistive sensor stack, said distance being greater than 10 nm.

15. The method as recited in claim 14, wherein said distance is less than or equal to 20 nm.

16. A method for forming a magnetoresistive sensor comprising:
    forming a magnetoresistive sensor stack, comprising a plurality of parallel layers deposited on a first shield layer;
    forming a first surface on said magnetoresistive sensor stack, said first surface oriented approximately perpendicular to said plurality of parallel layers;
    depositing a diamond like carbon layer on said first surface, said diamond like carbon layer having an exposed second surface subsequent to deposition of said diamond like carbon layer;
    depositing an oxide layer on said second surface of said diamond like carbon layer;
    depositing a second shield layer subsequent to depositing said oxide layer, such that said magnetorestrictive sensor stack is disposed between said first and second shield layers;
    removing a first portion of said oxide layer from at least a portion of said second surface of said diamond like carbon layer; and
    removing said diamond like carbon layer from said first surface of said magnetoresistive sensor stack to form an air bearing surface, said air bearing surface being approximately co-planar with said first surface of said magnetoresistive sensor stack.

17. The method as recited in claim 16, wherein said oxide layer comprises tantalum oxide.

18. The method as recited in claim 16, further comprising simultaneously removing by mechanical lapping a second portion of said oxide layer, a portion of said first shield layer, and a portion of said second shield layer, prior to removing said first portion of said oxide layer.

19. The method as recited in claim 16, wherein said first portion of said oxide layer is removed by ion milling.

20. The method as recited in claim 16 wherein said diamond like carbon film is removed by oxidation.

21. The method as recited in claim 16, wherein said magnetoresistive sensor is a magnetic tunnel junction (MTJ) sensor.

22. The method as recited in claim 16, wherein said diamond like carbon layer is greater than or equal to 2 nm thick, and less than or equal to 10 nm thick.

* * * * *